(12) United States Patent
Sekine

(10) Patent No.: US 10,645,322 B2
(45) Date of Patent: May 5, 2020

(54) IMAGE PICKUP DEVICE

(71) Applicant: CANON KABUSHIKI KAISHA, Tokyo (JP)

(72) Inventor: Hiroshi Sekine, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/215,783

(22) Filed: Dec. 11, 2018

(65) Prior Publication Data
US 2019/0191121 A1 Jun. 20, 2019

(30) Foreign Application Priority Data
Dec. 14, 2017 (JP) .................. 2017-239610

(51) Int. Cl.
*G06T 7/55* (2017.01)
*H04N 5/3745* (2011.01)
*H04N 5/359* (2011.01)
*H04N 5/341* (2011.01)
*H01L 27/146* (2006.01)

(52) U.S. Cl.
CPC ............ *H04N 5/3745* (2013.01); *G06T 7/55* (2017.01); *H04N 5/341* (2013.01); *H04N 5/359* (2013.01); *H04N 5/3592* (2013.01); *G06T 2207/30252* (2013.01); *H01L 27/14656* (2013.01)

(58) Field of Classification Search
None
See application file for complete search history.

(56) References Cited

U.S. PATENT DOCUMENTS

| | | | |
|---|---|---|---|
| 10,009,560 B2 | 6/2018 | Kobayashi et al. | |
| 2011/0007196 A1* | 1/2011 | Yamashita | H01L 27/14609 348/294 |
| 2014/0077058 A1 | 3/2014 | Sakano | |
| 2014/0084138 A1 | 3/2014 | Machida | |
| 2015/0264283 A1* | 9/2015 | Kobayashi | H04N 5/361 257/229 |
| 2016/0182839 A1* | 6/2016 | Shigeta | H04N 5/35581 348/362 |

(Continued)

FOREIGN PATENT DOCUMENTS

JP 2014-063889 A 4/2014

OTHER PUBLICATIONS

U.S. Appl. No. 16/040,144, filed Jul. 19, 2018 (First Named Inventor: Hajime Ikeda).

*Primary Examiner* — Eileen M Adams
(74) *Attorney, Agent, or Firm* — Venable LLP

(57) ABSTRACT

A pixel includes: a photoelectric conversion unit; a charge holding unit; a transfer unit which transfers a charge of the photoelectric conversion unit to the charge holding unit in an on-state; and an overflow control unit which discharges a charge of the photoelectric conversion unit in an on-state. There is a period in which both the transfer unit and the overflow control unit are in an off-state and the photoelectric conversion unit and the charge holding unit respectively hold a charge of a different frame. In a first mode, a first potential barrier is formed, the first potential barrier being lower than a potential barrier formed between the photoelectric conversion unit and the charge holding unit by the transfer unit in an off-state. In a second mode, a second potential barrier that is even lower than the first potential barrier is formed.

9 Claims, 18 Drawing Sheets

(56) References Cited

U.S. PATENT DOCUMENTS

2017/0078557 A1   3/2017  Kawabata et al.
2017/0078604 A1   3/2017  Kobayashi et al.
2018/0213167 A1   7/2018  Miki et al.

* cited by examiner

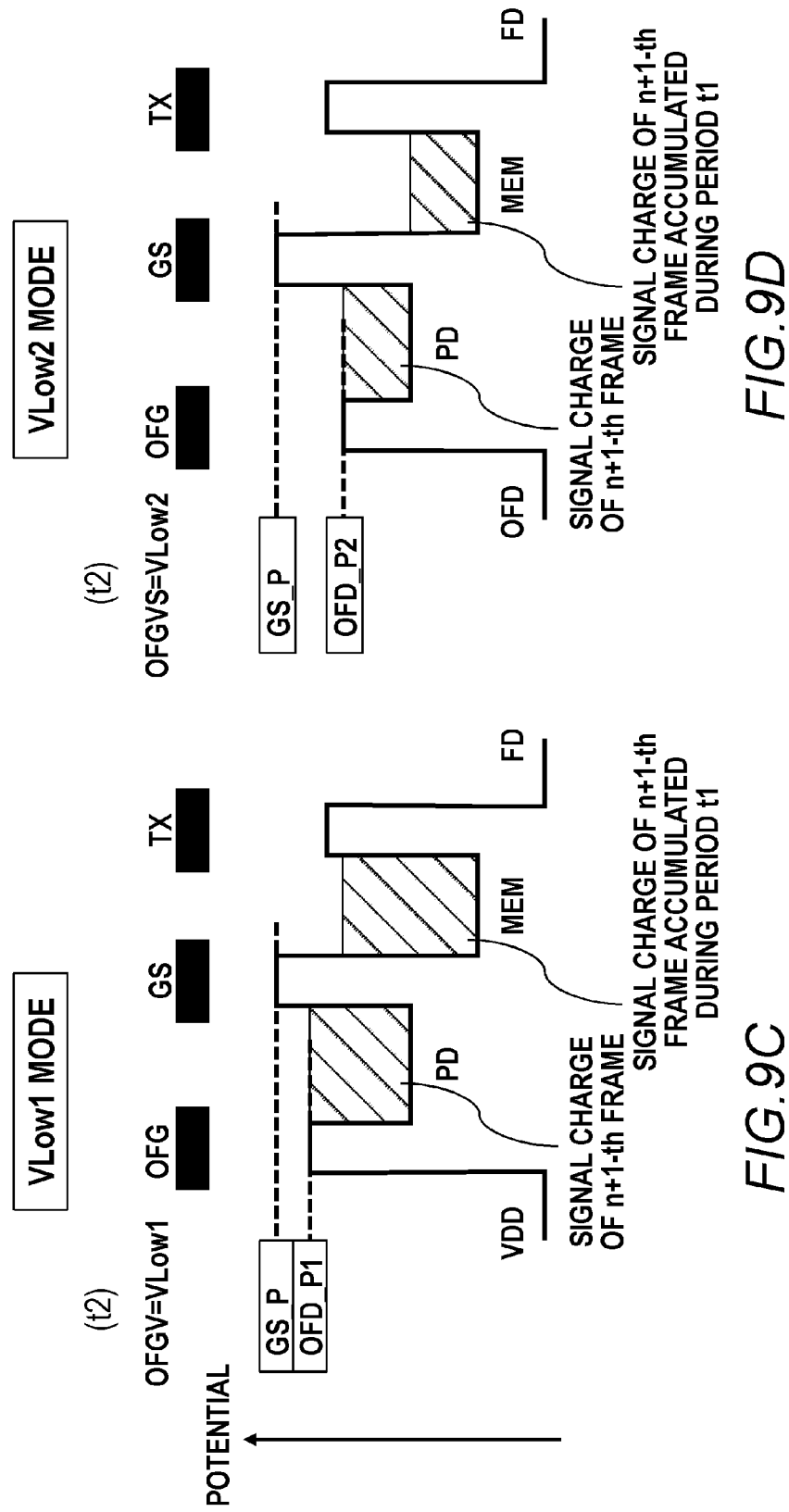

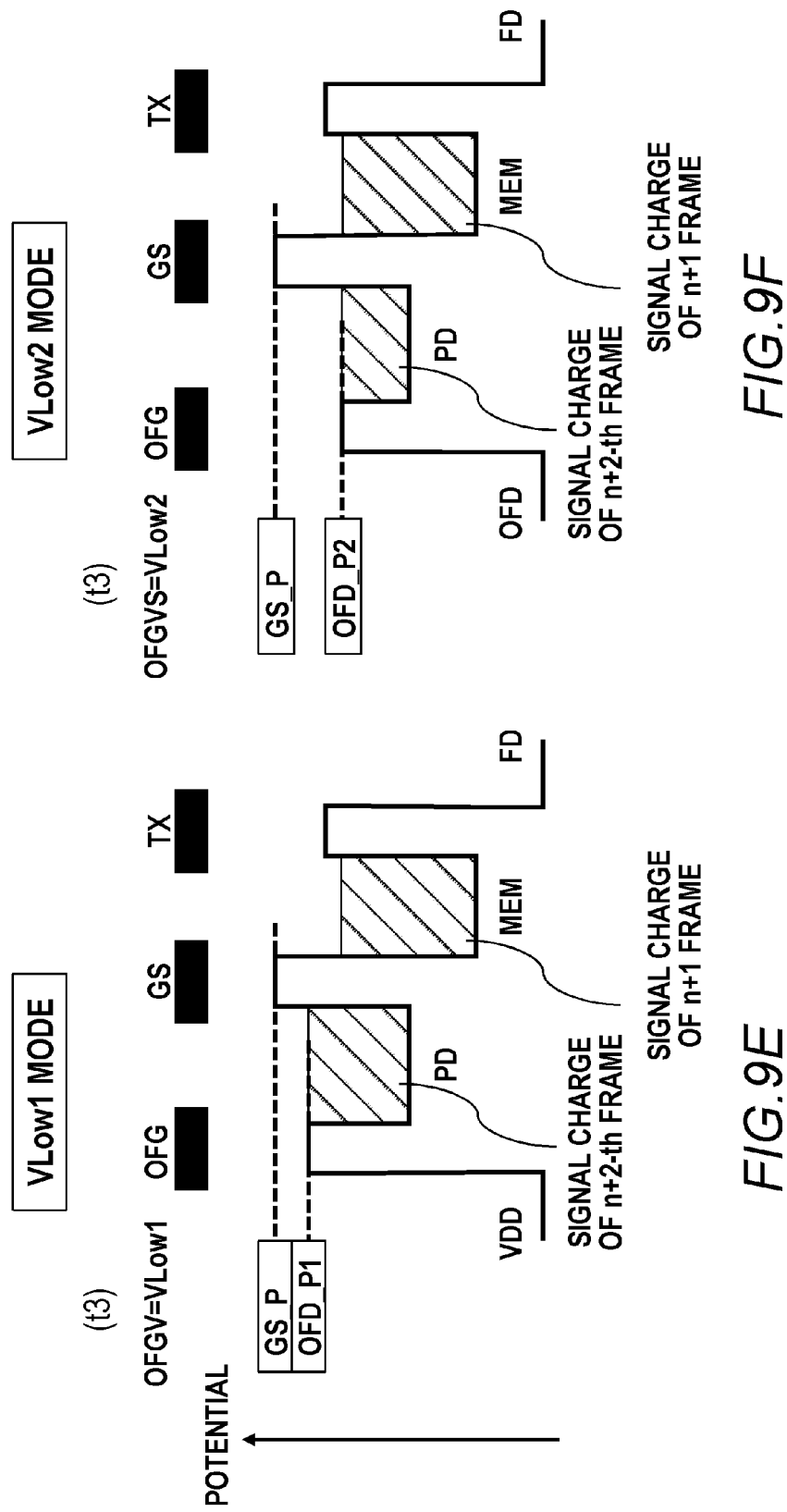

| GS PULSE DRIVE FREQUENCY | OFD POTENTIAL | SATURATION CHARGE AMOUNT OF PHOTOELECTRIC CONVERSION UNIT | OUTPUT (PIXEL SATURATION) | COLOR MIXING |
| --- | --- | --- | --- | --- |
| 1 | P1 | 10 | 10 | Poor |
| 2 | P2 | 5 | 10 | Fair |
| 4 | P4 | 2.5 | 10 | Good |
| 10 | P10 | 1 | 10 | Excellent |

*FIG.10A*

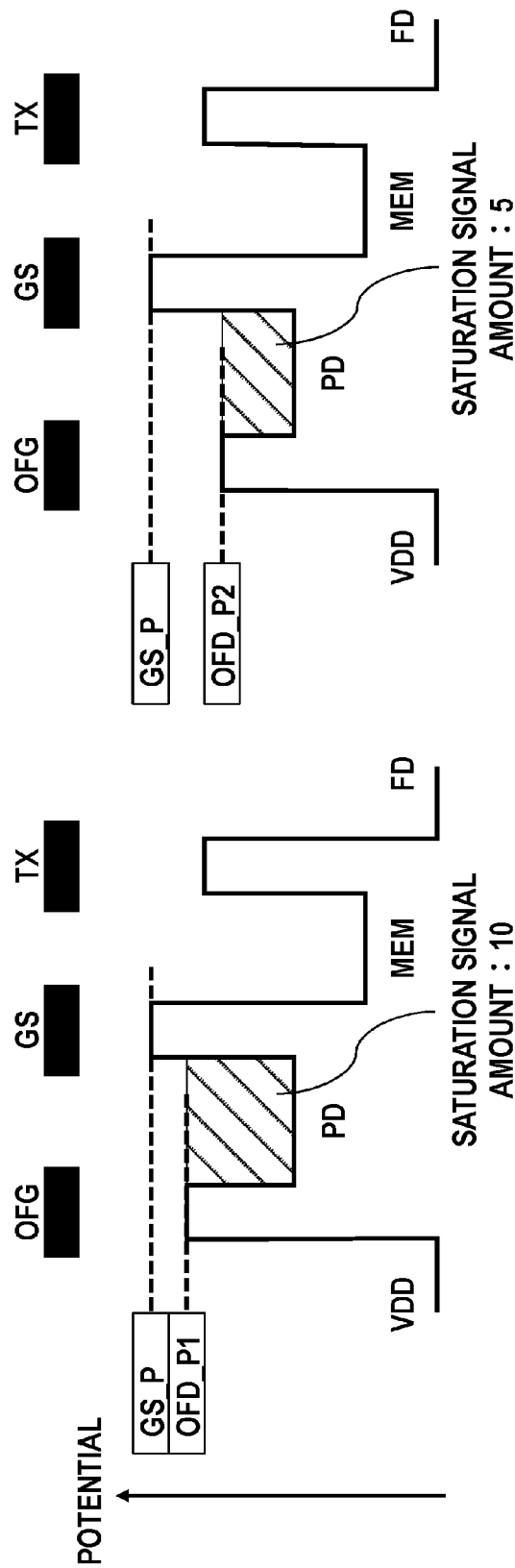

IMAGE PICKUP DEVICE

BACKGROUND OF THE INVENTION

Field of the Invention

The present invention relates to an image pickup device having a charge holding unit which enables global electronic shutter operations to be performed.

Description of the Related Art

Recently, CMOS image sensors suitable for low power consumption and fast readout are widely used in image pickup devices such as digital still cameras and digital video cameras. While CMOS image sensors generally operate on the basis of row-sequential readout, CMOS image sensors having a global (all-pixels simultaneous) electronic shutter function are being proposed (refer to Japanese Patent Application Laid-open No. 2014-63889). For the electronic shutter function, a charge holding unit which holds a charge for a certain amount of time is provided inside a pixel separately from a photoelectric conversion unit which performs photoelectric conversion.

SUMMARY OF THE INVENTION

When performing a global electronic shutter operation, there is a period in which charges of different frames are held in the photoelectric conversion unit and the charge holding unit. Generally, in such a period, a transfer gate between the photoelectric conversion unit and the charge holding unit is switched to an off-state and controlled so that charges are not transferred from the photoelectric conversion unit to the charge holding unit. However, even if the transfer gate is switched off, there is a possibility that charges having saturated the photoelectric conversion unit may climb over a potential barrier of the transfer gate and leak out to the side of the charge holding unit and, consequently, color mixing (mixing of charges of different frames) may occur. An occurrence of such color mixing causes a decline in image quality and is therefore undesirable.

The present invention has been made in consideration of the circumstances described above and an object thereof is to provide, in an image pickup device having a pixel controlled so as to have a period in which a photoelectric conversion unit and a charge holding unit respectively hold a charge of a different frame, a technique which enables an occurrence of color mixing due to leaking of a charge from the photoelectric conversion unit to the charge holding unit to be suppressed.

The present invention in its first aspect provides an image pickup device having a plurality of pixels, wherein one or more pixels among the plurality of pixels includes: a photoelectric conversion unit; a charge holding unit capable of holding a charge generated in the photoelectric conversion unit; a transfer unit which transfers a charge of the photoelectric conversion unit to the charge holding unit when being in an on-state; and an overflow control unit which discharges a charge of the photoelectric conversion unit when being in an on-state, the one or more pixels being controlled so as to have a period in which both the transfer unit and the overflow control unit are switched to an off-state and the photoelectric conversion unit and the charge holding unit respectively hold a charge of a different frame, and the overflow control unit has: a first mode in which a first potential barrier is formed, the first potential barrier being lower than a potential barrier formed between the photoelectric conversion unit and the charge holding unit by the transfer unit in an off-state; and a second mode in which a second potential barrier that is even lower than the first potential barrier is formed.

According to the present invention, in an image pickup device having a pixel controlled so as to have a period in which a photoelectric conversion unit and a charge holding unit respectively hold a charge of a different frame, an occurrence of color mixing due to leaking of a charge from the photoelectric conversion unit to the charge holding unit can be suppressed.

Further features of the present invention will become apparent from the following description of exemplary embodiments with reference to the attached drawings.

BRIEF DESCRIPTION OF THE DRAWINGS

FIGS. 9A to 9F are conceptual diagrams of pixel potentials (during accumulation);
FIGS. 10A to 10C are diagrams showing control of potentials when performing a plurality of transfers.

DESCRIPTION OF THE EMBODIMENTS

Hereinafter, an example of specific embodiments of an image pickup device according to the present invention will be described with reference to the drawings. An image pickup device is a semiconductor device having a plurality of pixels which convert light into an electrical signal and is also referred to as a solid-state image pickup element or an image sensor. Image pickup devices include a CCD image sensor and a CMOS image sensor. A configuration example in a case where the present invention is applied to a CMOS image sensor which performs global electronic shutter operations will be described below as a preferable application example of the present invention.

First Embodiment

Figure 1:
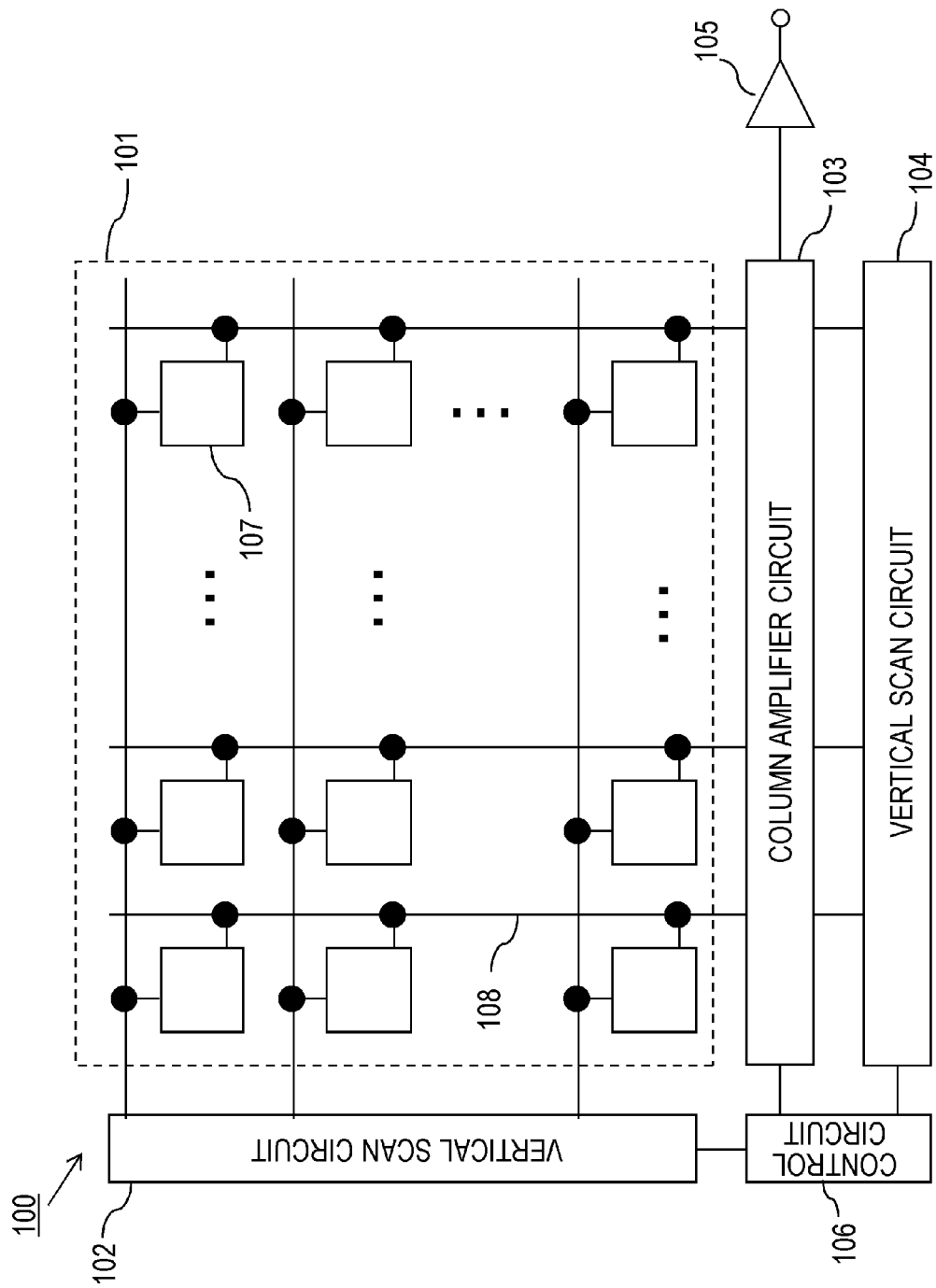
FIG. 1 is a block diagram of an image pickup device.

FIG. 1 is a block diagram showing a schematic configuration of an image pickup device according to the present embodiment. An image pickup device 100 includes a pixel portion 101, a vertical scan circuit 102, a column amplifier circuit 103, a horizontal scan circuit 104, an output circuit 105, and a control circuit 106. The pixel portion 101 includes a plurality of pixels 107 arranged in an XY matrix pattern. The control circuit 106 is a circuit which controls operation timings of the vertical scan circuit 102, the column amplifier circuit 103, the horizontal scan circuit 104, and the like. The vertical scan circuit 102 supplies a control signal for controlling a transistor in the pixel 107 to an on-state (a conductive state) or an off-state (a non-conductive state). Each column of the pixels 107 is provided with a column signal line 108, and signals from the pixels 107 are output to the column signal line 108 for each column. The column amplifier circuit 103 amplifies a pixel signal output to the column signal line 108, and performs correlated double sampling and the like based on a signal at the time of reset and a signal during photoelectric conversion of the pixels 107. The horizontal scan circuit 104 supplies a control signal for controlling a switch connected to an amplifier of the column amplifier circuit 103 to an on-state or an off-state. The output circuit 105 is constituted by a buffer amplifier, a differential amplifier, or the like and outputs a pixel signal from the column amplifier circuit 103 to a signal processing unit outside of the image pickup device 100. Alternatively, an AD conversion unit may be provided in the image pickup device 100 and may output a digital pixel signal.

Figure 2:
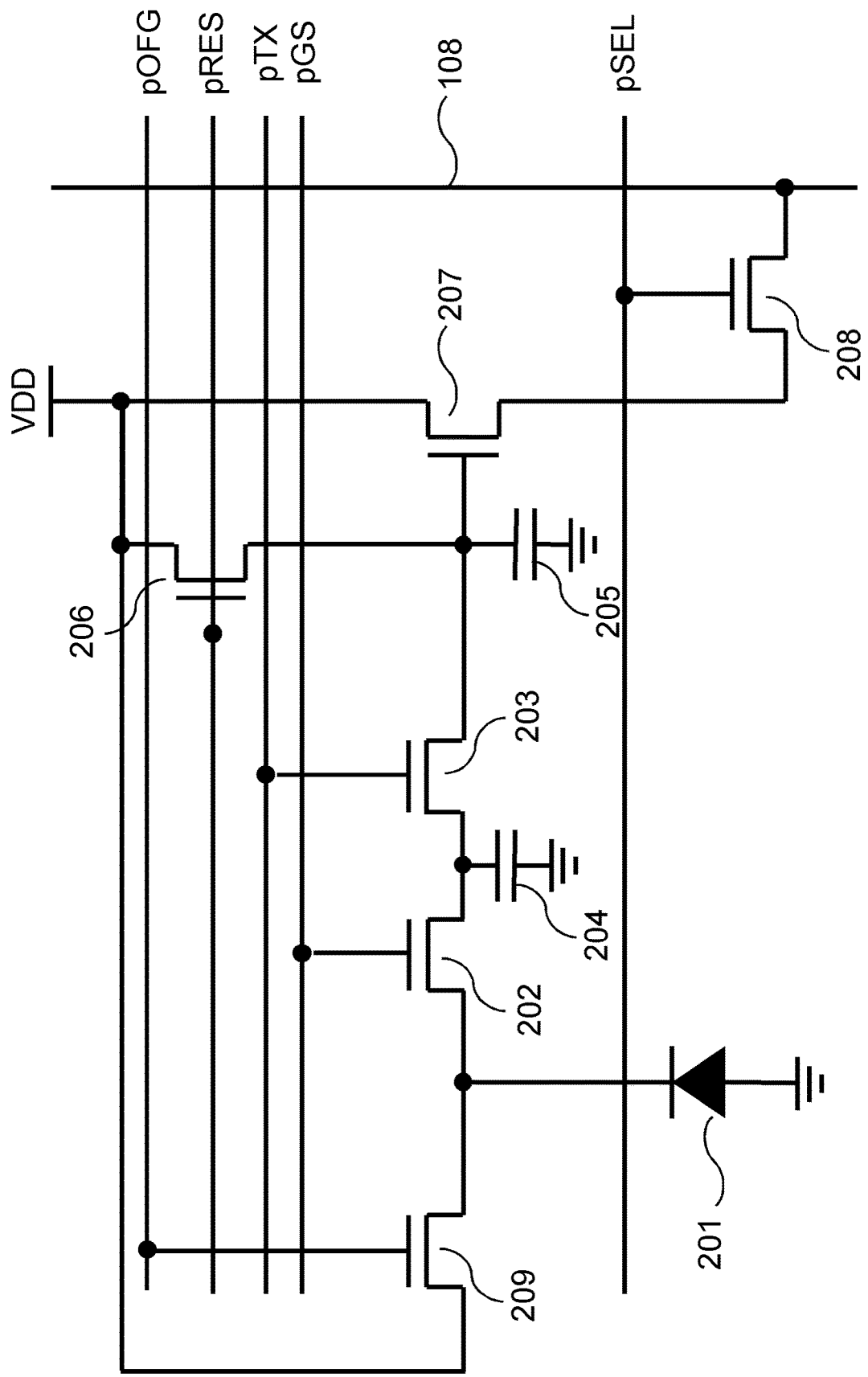
FIG. 2 is an equivalent circuit diagram of a pixel portion.

FIG. 2 shows an equivalent circuit of the pixels 107 of the image pickup device. The pixels 107 include a photoelectric conversion unit 201, a first transfer unit 202, a second transfer unit 203, a charge holding unit 204, and a floating diffusion 205. The pixels 107 further include a reset unit 206, an amplifier unit 207, a row selection unit 208, and an overflow control unit 209.

The photoelectric conversion unit 201 is an element which generates and accumulates charges due to light reception and is constituted by, for example, a light receiving element such as a photodiode. The first transfer unit 202 transfers a charge of the photoelectric conversion unit 201 to the charge holding unit 204. The charge holding unit 204 (also referred to as a charge accumulating unit) is an element capable of holding a charge independently of the photoelectric conversion unit 201. The second transfer unit 203 transfers a charge of the charge holding unit 204 to the floating diffusion 205 which is an input node of the amplifier unit 207. The reset unit 206 resets voltage of the floating diffusion 205. The row selection unit 208 is a switch for selecting a pixel to output a signal to the column signal line 108. The amplifier unit 207 outputs a signal based on a charge generated due to light reception to the column signal line 108 via the row selection unit 208. In addition, the overflow control unit 209 discharges a charge of the photoelectric conversion unit 201 to a power supply node such as an overflow drain during non-exposure.

The first transfer unit 202, the second transfer unit 203, and the overflow control unit 209 are, respectively, MOS transistors. A control line pGS is connected to the first transfer unit 202. A control line pTX is connected to the second transfer unit 203. A control line pOFG is connected to the overflow control unit 209.

When an off-state voltage is applied to a gate of the first transfer unit 202 via the control line pGS (an off-state), a potential barrier is formed between the photoelectric conversion unit 201 and the charge holding unit 204 and a state is created where charges are accumulable in the photoelectric conversion unit 201. When an on-state voltage is applied to the gate of the first transfer unit 202 via the control line pGS (an on-state), charges accumulated in the photoelectric conversion unit 201 are transferred to the charge holding unit 204.

When an off-state voltage is applied to a gate of the second transfer unit 203 via the control line pTX (an off-state), a potential barrier is formed between the charge holding unit 204 and the floating diffusion 205 and a state is created where charges are accumulable in the charge holding unit 204. When an on-state voltage is applied to the gate of the second transfer unit 203 via the control line pTX (an on-state), charges accumulated in the charge holding unit 204 are transferred to the floating diffusion 205.

When an off-state voltage is applied to a gate of the overflow control unit 209 via the control line pOFG (an off-state), a potential barrier is formed between the photoelectric conversion unit 201 and the power supply node and a state is created where charges are accumulable in the photoelectric conversion unit 201. When an on-state voltage is applied to the gate of the overflow control unit 209 via the control line pOFG (an on-state), charges accumulated in the photoelectric conversion unit 201 are discharged to the power supply node.

Figure 3:
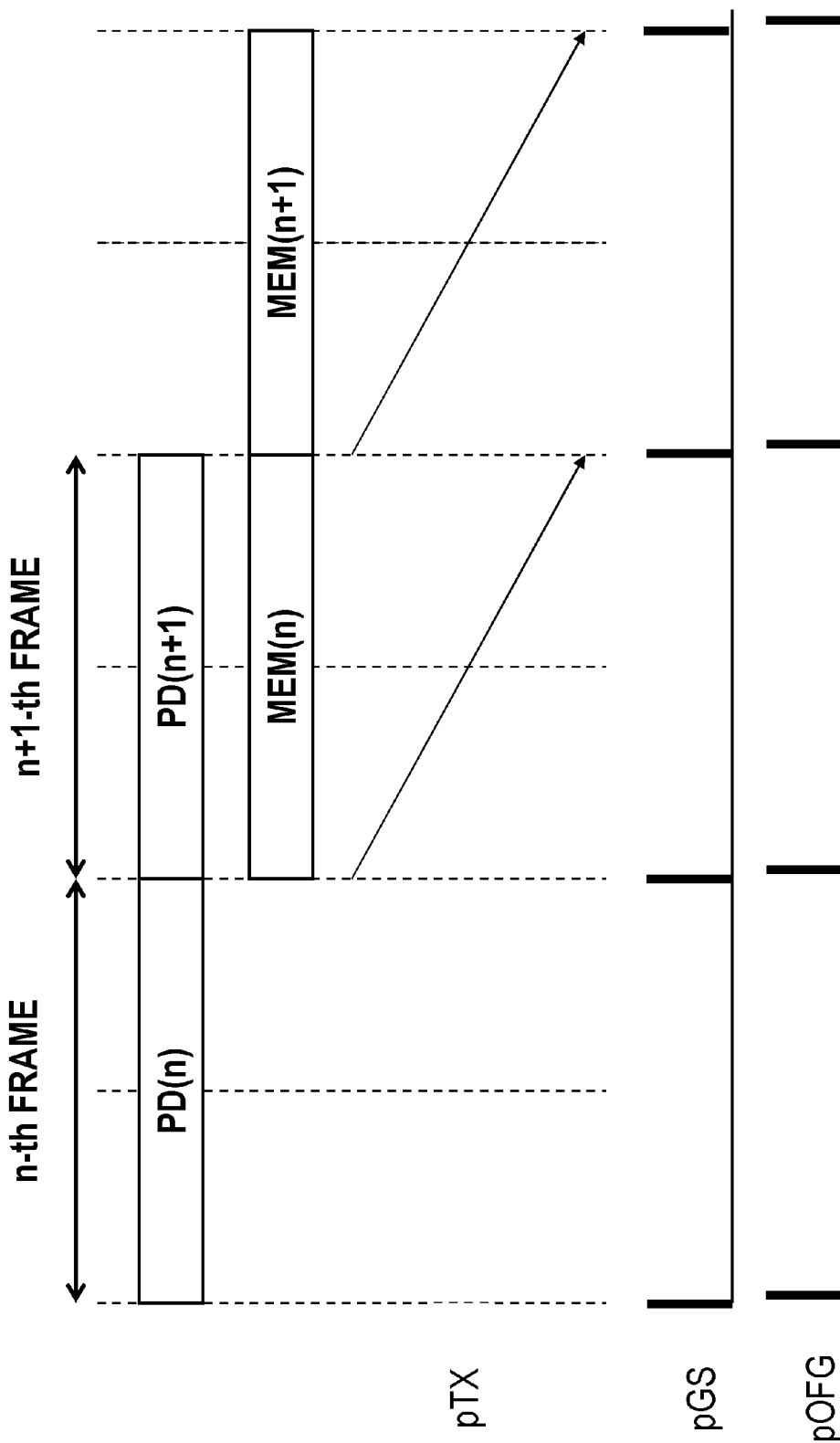
FIG. 3 is a conceptual diagram of pixel potentials.

FIG. 3 schematically shows pixel drive timings in a global electronic shutter system. A transverse direction in FIG. 3 represents a time axis. PD(n) denotes a period in which a charge generated in the photoelectric conversion unit 201 in an n-th frame is held in the photoelectric conversion unit 201. MEM(n) denotes a period in which a charge of the n-th frame is held in the charge holding unit 204. pGS denotes a timing at which the first transfer unit 202 is switched to the on-state, and pOFG denotes a timing at which the overflow control unit 209 is switched to the on-state. pTX denotes a timing at which the second transfer unit 203 is switched to the on-state (a vertical direction corresponds to row numbers, and diagonal lines schematically indicate that the second transfer unit 203 is sequentially driven per row).

As shown in FIG. 3, the charge of the n-th frame is accumulated and held in the photoelectric conversion unit 201 during the period PD(n). In addition, the first transfer unit 202 is turned on at an end timing of the n-th frame and the charge of the n-th frame having been accumulated in the photoelectric conversion unit 201 is collectively transferred to the charge holding unit 204. Subsequently, the second transfer unit 203 is turned on for each row and the charge of the n-th frame accumulated in the charge holding unit 204 is sequentially transferred to the floating diffusion 205. Accordingly, a pixel signal of the n-th frame is sequentially read starting from a first row. Accordingly, a global electronic shutter operation is realized.

With such a driving system, a charge of an n+1-th frame is to be accumulated in the photoelectric conversion unit 201 (PD(n+1)) during the period MEM(n) in which the charge of the n-th frame is held in the charge holding unit 204. In other words, there is a period in which charges of different frames are respectively held in the photoelectric conversion unit 201 and the charge holding unit 204.

Figure 4A:
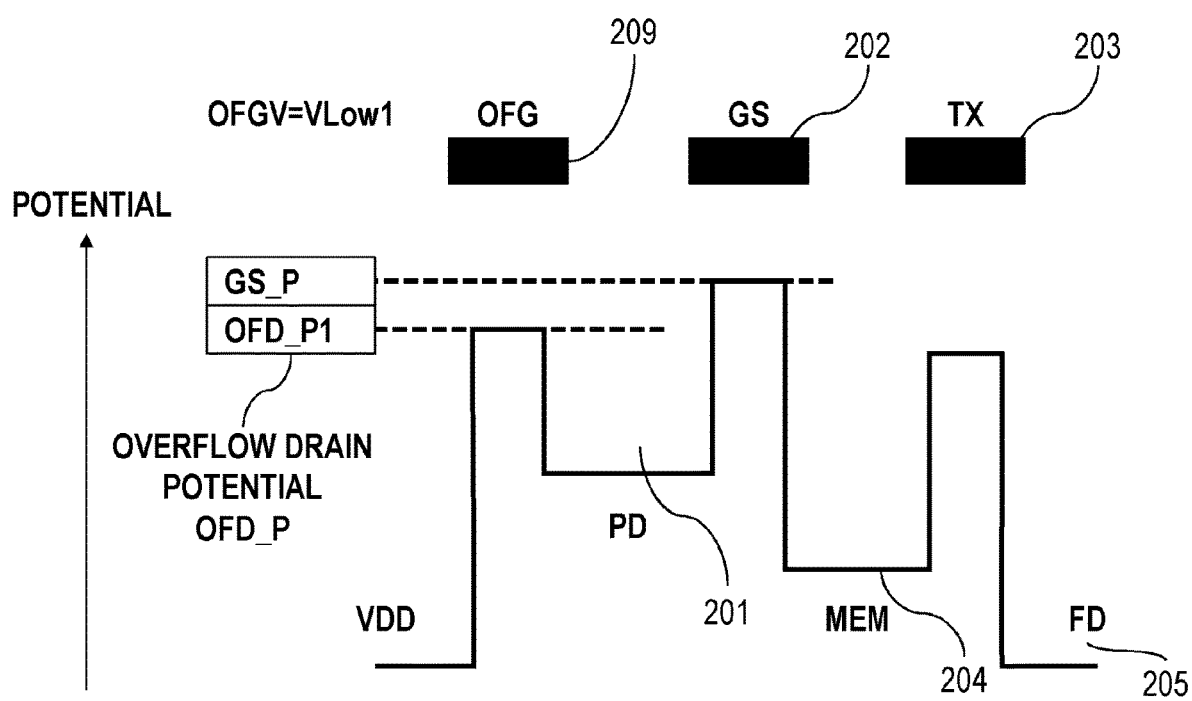
FIGS. 4A and 4B are diagrams showing drive of pixels.
Figure 4B:
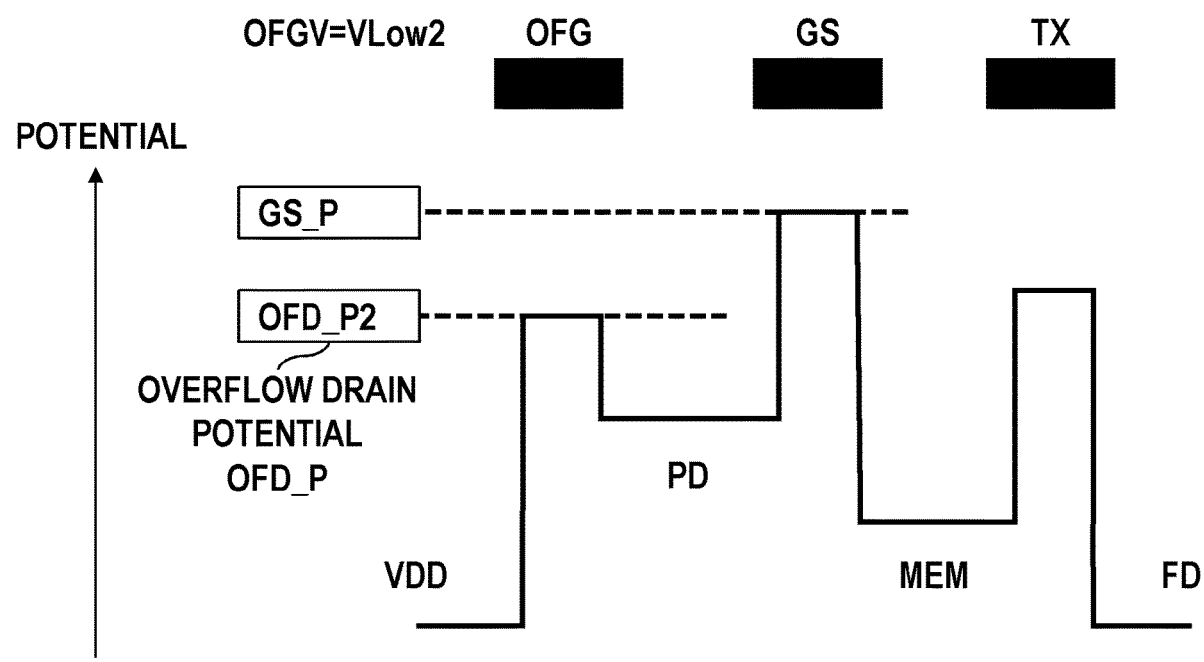

FIGS. 4A and 4B show conceptual diagrams of potentials of the pixel shown in FIG. 2. In the diagrams, OFG denotes the overflow control unit 209, GS denotes the first transfer unit 202, and TX denotes the second transfer unit 203. VDD denotes the power supply node, PD denotes the photoelectric conversion unit 201, MEM denotes the charge holding unit 204, and FD denotes the floating diffusion 205. OFGV denotes voltage applied to the gate of the overflow control unit 209, OFD_P1 and OFD_P2 denote potential barriers formed by the overflow control unit 209 in the off-state, and GS_P denotes a potential barrier formed by the first transfer unit 202 in the off-state. Hereinafter, a potential barrier formed by the overflow control unit 209 will also be referred to as an overflow drain potential (an OFD potential). In addition, the gate of the overflow control unit 209 will also be referred to as an OFG gate.

The overflow control unit 209 has a plurality of modes (in the present example, two modes) with different OFD potentials as modes in the off-state. In the present embodiment, the OFD potentials (OFD_P1 and OFD_P2) are controlled with off-state voltages $V_{Low1}$ and $V_{Low2}$ ($V_{Low1} < V_{Low2}$) of the OFG gate. FIG. 4A represents a case where the off-state voltage of the OFG gate is $V_{Low1}$ and FIG. 4B represents a case where the off-state voltage of the OFG gate is $V_{Low2}$, in which respective OFD potentials have a relationship expressed as OFD_P1>OFD_P2.

With a general global shutter pixel, a saturation amount (an accumulable amount of charges) of the charge holding unit 204 is larger than the saturation amount of the photoelectric conversion unit 201. Therefore, a saturation charge amount as a pixel is regulated by the saturation amount of the photoelectric conversion unit 201. In addition, in a configuration such as that of the present embodiment, the saturation amount of the photoelectric conversion unit 201 varies in accordance with a height of the OFD potential. Therefore, the saturation charge amount of a pixel is larger in the mode with a high OFD potential (FIG. 4A) than in the mode with a low OFD potential (FIG. 4B).

Figure 5A:
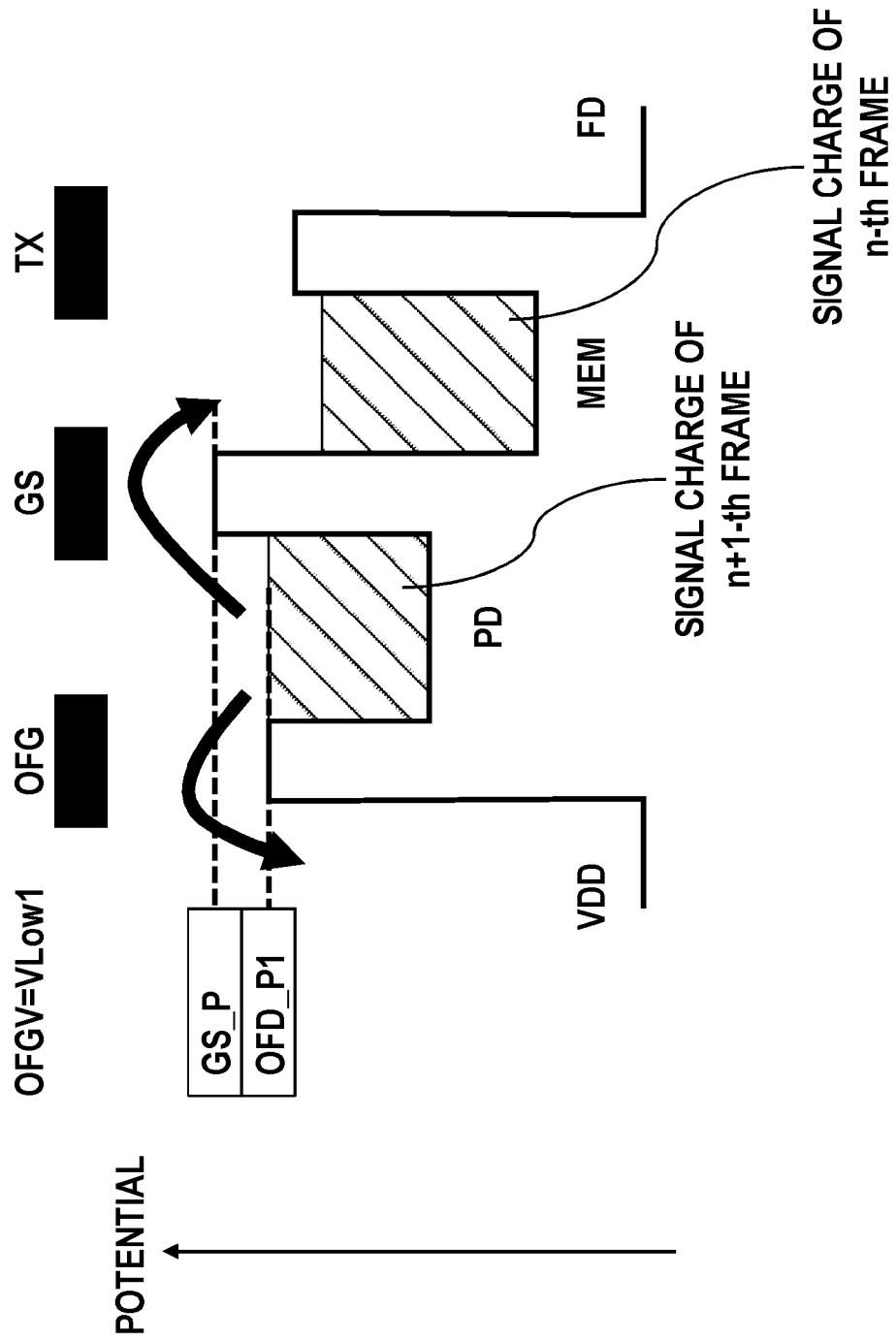
FIGS. 5A and 5B are diagrams showing drive of pixels (a plurality of transfers)
Figure 5B:
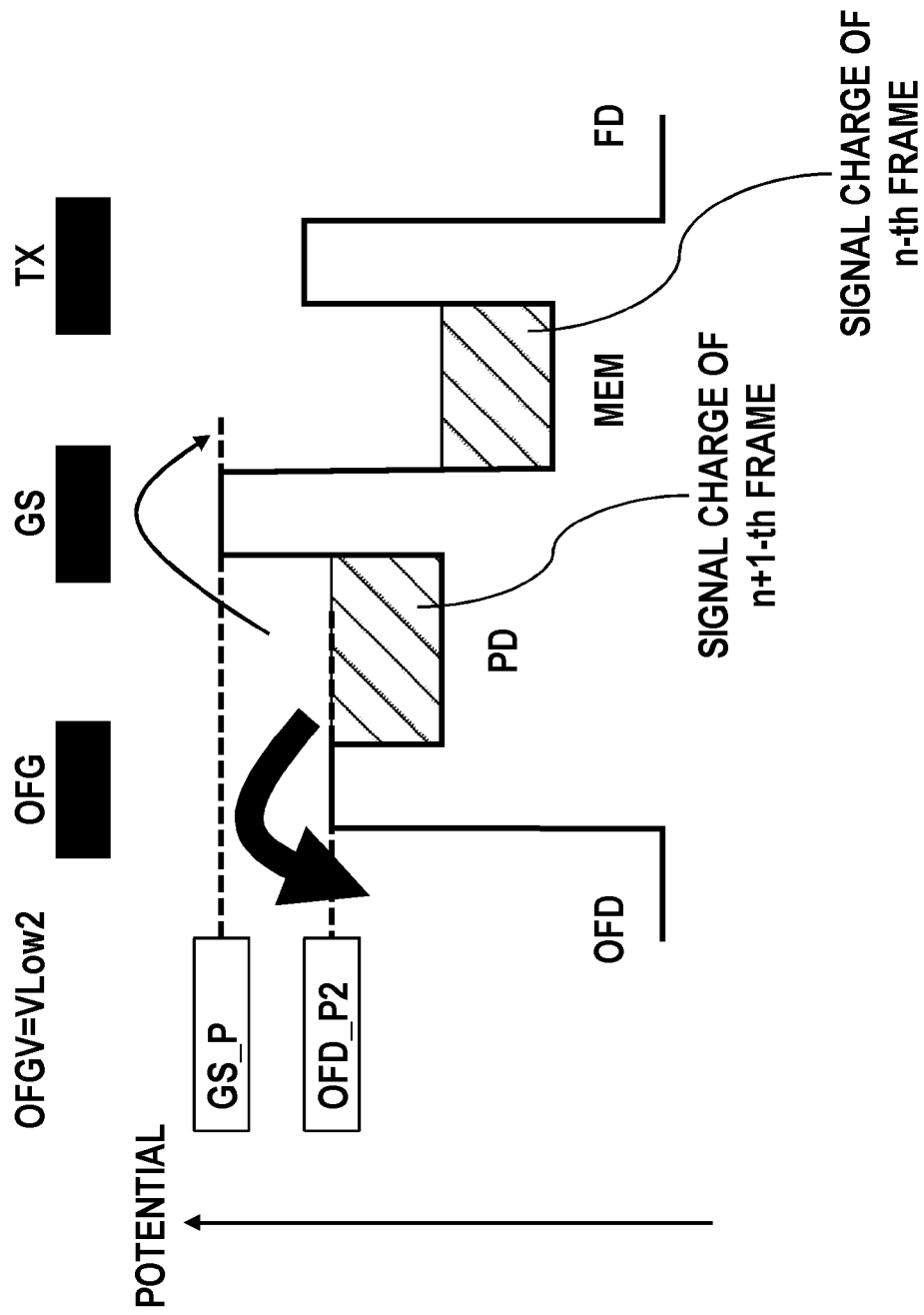

FIGS. 5A and 5B conceptually show potentials of a given pixel in a period where the charge of the n+1-th frame is accumulated in the photoelectric conversion unit 201 during the pixel drive shown in FIG. 3. When a surplus charge exceeding the saturation amount of the photoelectric conversion unit 201 is generated in the n+1-th frame, the surplus charge leaks out to wherever the potential barrier is lowest. However, since the charge has kinetic energy, the smaller the difference between the potential (GS_P) under the gate of the first transfer unit 202 and the OFD potentials (OFD_P1 and OFD_P2), the larger the ratio of surplus charge leaking out to the side of the charge holding unit 204. In other words, color mixing increases. Therefore, when FIGS. 5A and 5B are compared with one another from the perspective of color mixing, it is found that the mode shown in FIG. 5B (the mode with lower OFD potential) better suppresses color mixing.

As described above, by having two values of the OFD potential such as OFD_P1 and OFD_P2 as in the present embodiment, a mode (FIG. 5B) capable of reducing color mixing can be realized in addition to a mode (FIG. 5A) capable of sufficiently securing a saturation charge amount of a pixel. Therefore, by appropriately switching between the saturation charge amount-priority mode and the color mixing reduction mode in accordance with operations and applications of the image pickup device, a relationship of the image pickup device with external circuits, and the like, an image with a quality satisfying needs can be obtained. For example, in cases where charges need not be accumulated to the maximum saturation amount of a pixel, switching to the mode with low OFD potential enables an image with less color mixing (or without any color mixing) to be obtained. A case where charges need not be accumulated to the maximum saturation amount is, for example, a case where a maximum value of a signal output from the image pickup device is determined by a circuit-side dynamic range instead of the saturation charge amount of a pixel.

Figure 6B:
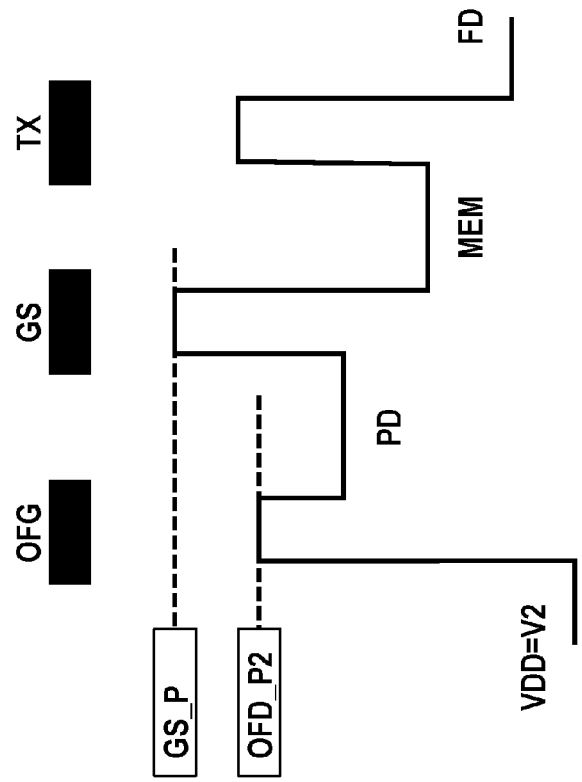
FIGS. 6A and 6B are diagrams showing variations in a control method of pixel potentials.
Figure 6A:
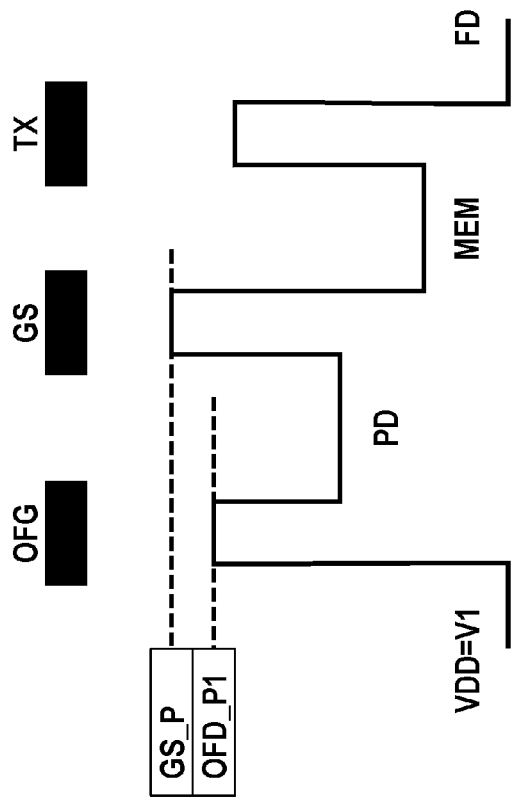

While an example in which the height of the OFD potential is controlled by changing an off-state voltage applied to the OFG gate has been described in the present embodiment, a method of controlling the height of the OFD potential is not limited to this example. For example, as shown in FIGS. 6A and 6B, the OFD potential may be controlled by changing a drain voltage (in the configuration according to the present embodiment, a level of the power supply VDD) of the overflow control unit 209. According to this method, since the voltage to be applied to the gate of the overflow control unit 209 need only have two values of on and off, there is an advantage that a driving circuit can be simplified.

Figure 7:
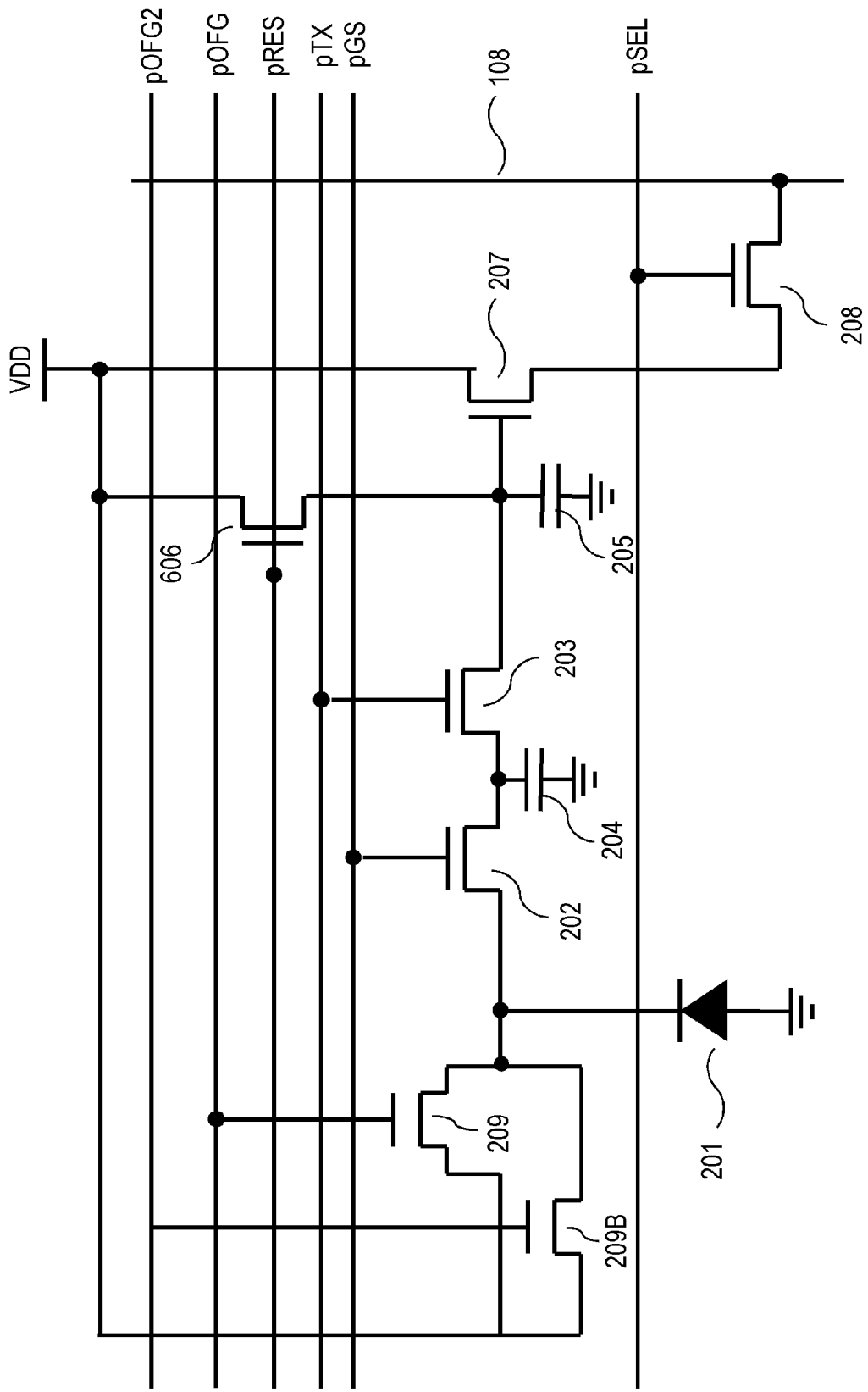
FIG. 7 is an equivalent circuit diagram of a pixel portion.

Alternatively, the OFD potential may be controlled by configuring the overflow control unit 209 with a plurality of transistors and changing a combination of on-states and off-states of the plurality of transistors. For example, in an example shown in FIG. 7, two MOS transistors (a first transistor 209A and a second transistor 209B) are connected in parallel. A height of the potential under a gate of the first transistor 209A in the on-state differs from a height of the potential under a gate of the second transistor 209B in the on-state. Potentials of the on-state and the off-state of the first transistor 209A are respectively denoted by OFG1_Pon and OFG1_Poff, and potentials of the on-state and the off-state of the second transistor 209B are respectively denoted by OFG2_Pon and OFG2_Poff. The respective transistors are configured so as to satisfy OFG1_Poff≥OFG2_Poff>OFG1_Pon>OFG2_Pon. In this case, for example, by setting OFG2_Poff to a potential similar to OFD_P1 in FIG. 4A and setting OFG1_Pon to a potential similar to OFD_P2 in FIG. 4B, OFD potential can be controlled as follows.

TABLE 1

| Mode of overflow control unit | State of first transistor | State of second transistor | OFD potential |
|---|---|---|---|
| Discharge | ON | ON | OFG2_Pon |
| Saturation charge amount priority | OFF | OFF | OFG2_Poff |
| Color mixing reduction | ON | OFF | OFG1_Pon |

Specifically, when both transistors are switched to the on-state, the OFD potential reaches a lowest state and the charge of the photoelectric conversion unit 201 is discharged. In addition, when both transistors are switched to the off-state, since a potential barrier similar to that shown in FIG. 4A is formed, a saturation charge amount in the photoelectric conversion unit 201 can be sufficiently secured. Furthermore, when one of the transistors is switched to the on-state and the other is switched to the off-state, since a low potential barrier similar to that shown in FIG. 4B is formed, color mixing can be suppressed. According to this method, since the voltage to be applied to the gate of each transistor need only have two values of on and off, there is an advantage that a driving circuit can be simplified.

Alternatively, a configuration may be adopted in which appropriately combining the three methods of controlling the gain voltage, controlling the drain voltage, and combining a plurality of transistors enables a plurality of OFD potentials to be formed.

Second Embodiment

The second embodiment represents an example in which transfer of a charge from the photoelectric conversion unit 201 to the charge holding unit 204 is performed a plurality of times during a period of one frame. Since the only difference from the first embodiment is in the way a pixel is driven, the following description will focus on portions that differ from the first embodiment and same portions will be omitted.

Figure 8:
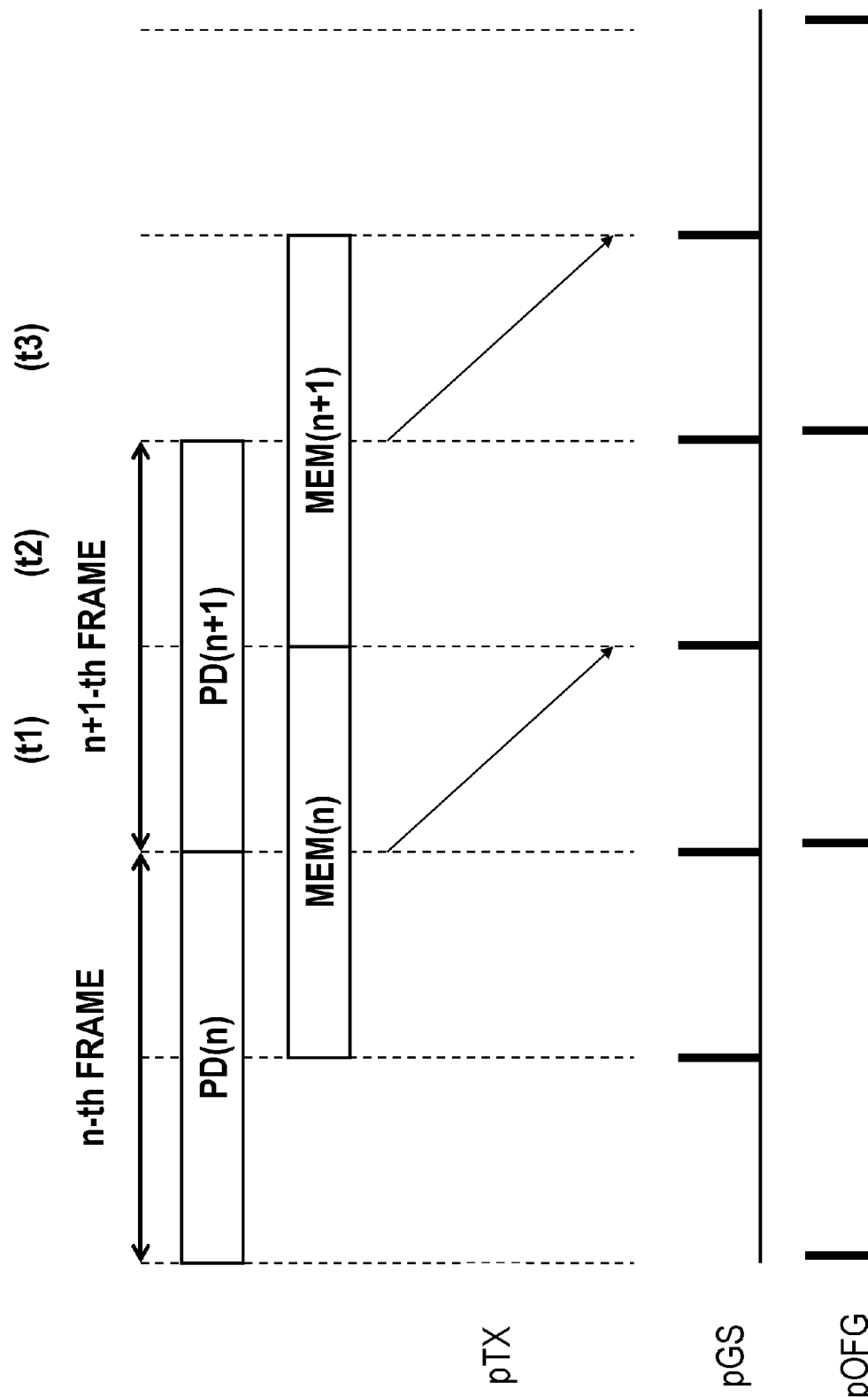
FIG. 8 is a diagram showing drive of pixels (a plurality of transfers)
Figures 9A, 9B:
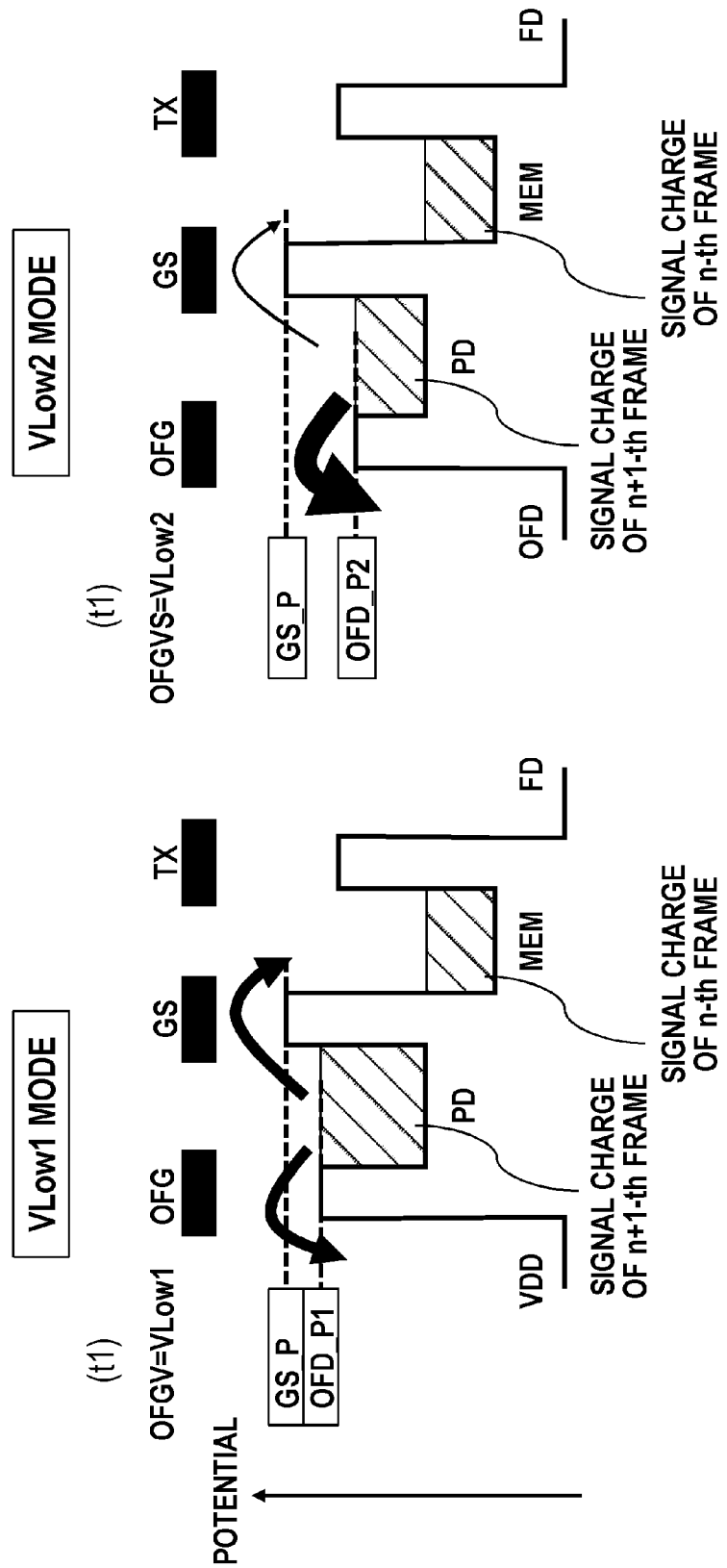

In the pixel drive according to the second embodiment, as shown in FIG. 8, an on-state voltage is applied to the first transfer unit 202 twice during one frame period. In other words, a charge is transferred twice from the photoelectric conversion unit 201 to the charge holding unit 204 during one frame period. In the case of such a pixel drive, the second transfer unit 203 cannot be driven until the second transfer is completed and the first transfer cannot be performed when the second transfer unit 203 is being driven. Therefore, when a charge is transferred twice, readout timings are as shown in FIG. 8.

FIGS. 9A to 9F schematically show how a charge is accumulated and transferred when the pixel drive illustrated in FIG. 8 is performed. t1, t2, and t3 correspond to time points shown in FIG. 8. A VLow1 mode is a mode in which the off-state voltage applied to the OFG gate is VLow1, and a VLow2 mode is a mode in which the off-state voltage applied to the OFG gate is VLow2. In the VLow1 mode, a potential is set such that the saturation charge amount of the photoelectric conversion unit 201 becomes approximately similar to the saturation charge amount of the charge holding unit 204. It should be noted that, for the sake of convenience, the saturation charge amount of the photoelectric conversion unit in the VLow2 mode is set to ½ of the saturation charge amount of the photoelectric conversion unit in the VLow1 mode. In addition, a case where light is striking a light receiving element in an amount that sufficiently saturates a pixel in one frame period will be considered.

Comparing the VLow1 mode with the VLow2 mode over time, at a time point t1, a signal of the n-th frame is in the charge holding unit 204 in both modes and a problem of color mixing described in the first embodiment occurs. In addition, the color mixing is more prominent in the VLow1 mode. Subsequently, at a time point t2, both modes enter a state in which a charge of the n+1-th frame is being transferred from the photoelectric conversion unit 201 to the charge holding unit 204. Charge amounts accumulated in the charge holding unit 204 at this point are VLow1 mode: VLow2 mode=2:1. Finally, at a time point t3, since a charge is further transferred from the photoelectric conversion unit 201 to the charge holding unit 204, charge amounts accumulated in the charge holding unit 204 become VLow1 mode: VLow2 mode=2:2 and a similar saturation amount can be obtained. In other words, when transfer is performed twice, drive in the VLow2 mode enables color mixing to be reduced without sacrificing saturation.

Based on the principle described above, results of conceivable cases where the number of transfers in one frame period is further increased are as shown in FIGS. 10A to 10C. A GS pulse drive frequency represents the number of times the on-state voltage is applied to the gate of the first transfer unit 202 or, in other words, the number of transfers in one frame period. Therefore, when performing a plurality of transfers in one frame period, OFD potential can be lowered and color mixing can be reduced without sacrificing saturation. In addition, the larger the number of transfers, the more the OFD potential can be lowered and the greater the color mixing reduction effect. Therefore, controlling the height of the OFD potential in accordance with the number of transfers is also preferable.

Third Embodiment

Figure 11:
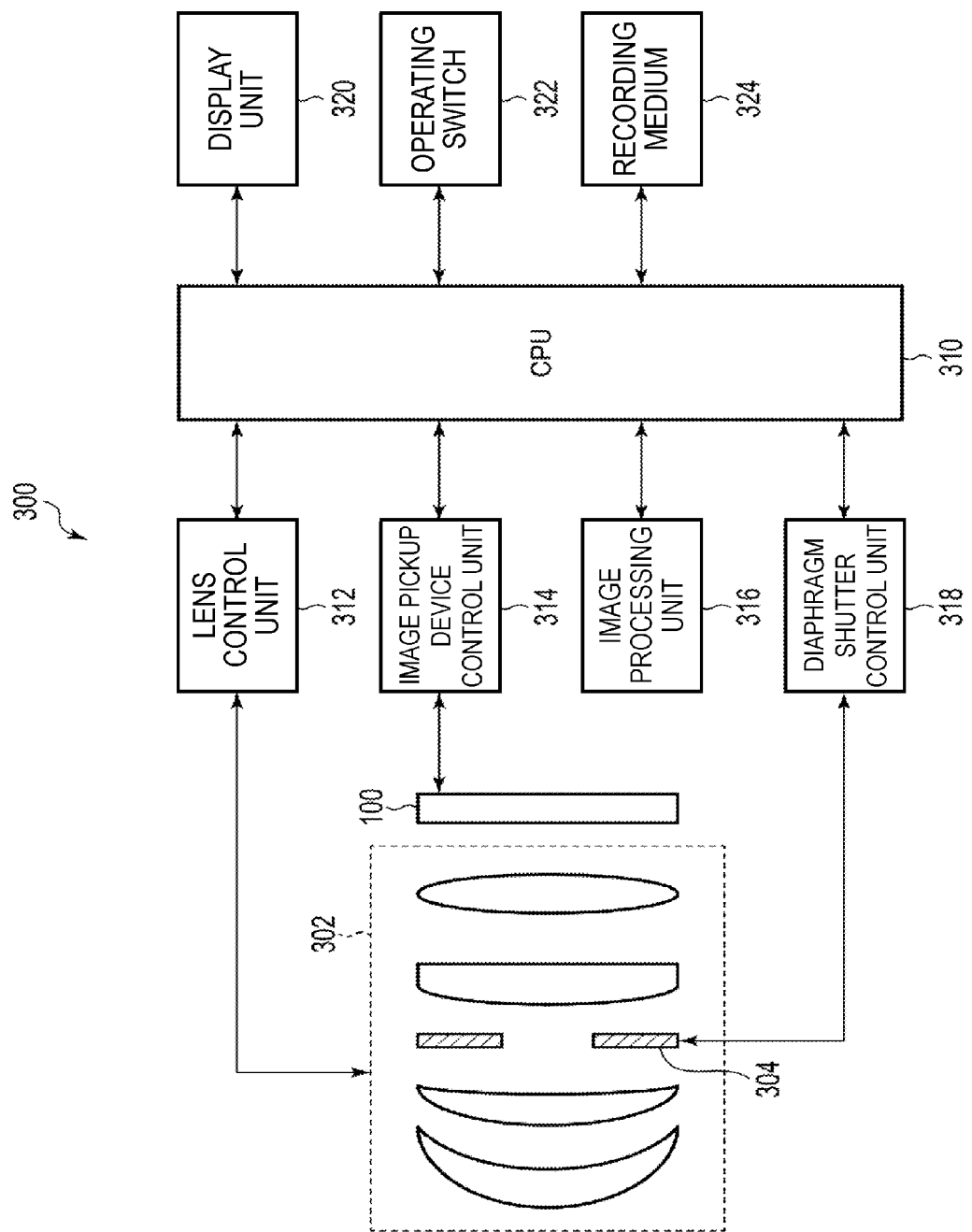
FIG. 11 is a configuration diagram of an image pickup system.

An image pickup system according to the third embodiment of the present invention will be described with reference to FIG. 11. FIG. 11 is a block diagram showing a schematic configuration of the image pickup system according to the present embodiment.

The image pickup device 100 described in the first or second embodiment can be applied to various image pickup systems. While applicable image pickup systems are not particularly limited, examples thereof include a digital still camera, a digital camcorder, a monitoring camera, a copier, a facsimile, a mobile phone, a vehicle-mounted camera, and an observation satellite. In addition, camera modules provided with an optical system such as a lens and an image pickup device are also included in image pickup systems. FIG. 11 shows a block diagram of a digital still camera as an example of such image pickup systems.

As shown in FIG. 11, an image pickup system 300 includes an image pickup optical system 302, a CPU 310, a lens control unit 312, an image pickup device control unit 314, an image processing unit 316, a diaphragm shutter control unit 318, a display unit 320, an operating switch 322, and a recording medium 324.

The image pickup optical system 302 is an optical system for forming an optical image of an object and includes a lens group, a diaphragm 304, and the like. The diaphragm 304 is equipped with a function for performing light amount adjustment during photography by adjusting an opening size thereof as well as a function as an exposure time adjustment shutter during still image photography. The lens group and the diaphragm 304 are held so as to be movable back and forth along an optical axis direction, and a variable magnification function (a zoom function) and a focusing function are realized by interlocked operations of the lens group and the diaphragm 304. The image pickup optical system 302 may be integrated with the image pickup system or may be an image pickup lens that is mountable to the image pickup system.

The image pickup device 100 is disposed in an image space of the image pickup optical system 302 so that an image pickup plane of the image pickup device 100 is positioned in the image space. The image pickup device 100 is the image pickup device 100 described in the first or second embodiment and is configured to include a CMOS sensor (the pixel portion 101) and peripheral circuits (a peripheral circuit region) thereof. In the image pickup device 100, a plurality of pixels with a photoelectric conversion unit are two-dimensionally arranged, and a color filter is disposed relative to the pixels to constitute a two-dimensional single-board color sensor. The image pickup device 100 photoelectrically converts an object image formed by the image pickup optical system 302 and outputs the photoelectrically converted object image as an image signal or a focus detection signal.

The lens control unit 312 is for performing variable magnification operations and focusing by controlling forward and backward drive of the lens group of the image pickup optical system 302 and is constituted by circuits and processing devices configured so as to realize such functions. The diaphragm shutter control unit 318 is for adjusting a photography light amount by varying an opening size of the diaphragm 304 (by making an aperture value variable) and is constituted by circuits and processing devices configured so as to realize such a function.

The CPU 310 is a control device inside the camera which performs various control of a camera main body, and includes a calculating unit, a ROM, a RAM, an A/D converter, a D/A converter, a communication interface circuit, and the like. The CPU 310 controls operations of various parts inside the camera in accordance with a computer program stored in the ROM or the like and executes a series of photographic operations such as AF, image pickup, image processing, and recording including detection of a focus state (focus detection) of the image pickup optical system 302. The CPU 310 is also a signal processing unit.

The image pickup device control unit 314 is for controlling operations of the image pickup device 100 as well as subjecting a signal output from the image pickup device 100 to A/D conversion and transmitting the signal subject to A/D conversion to the CPU 310, and is constituted by circuits and control devices configured so as to realize such functions. The A/D conversion function may be provided in the image pickup device 100. The image processing unit 316 is for performing image processing such as γ conversion and color interpolation on the signal subject to A/D conversion and generating an image signal and is constituted by circuits and control devices configured so as to realize such functions. The display unit 320 is a display device such as a liquid crystal display device (LCD) and displays information related to a photography mode of the camera, a preview image prior to photography, a confirmation image after photography, a focusing state upon focus detection, and the like. The operating switch 322 is constituted by a power supply switch, a release (photography trigger) switch, a zoom operation switch, a photography mode selection switch, and the like. The recording medium 324 is for storing photographed images and the like and may be built into the image pickup system or may be a mountable and detachable recording medium such as a memory card.

By configuring the image pickup system 300 to which the image pickup device 100 according to the first or second embodiment is applied as described above, a high performance image pickup system can be realized.

Fourth Embodiment

Figure 12A:
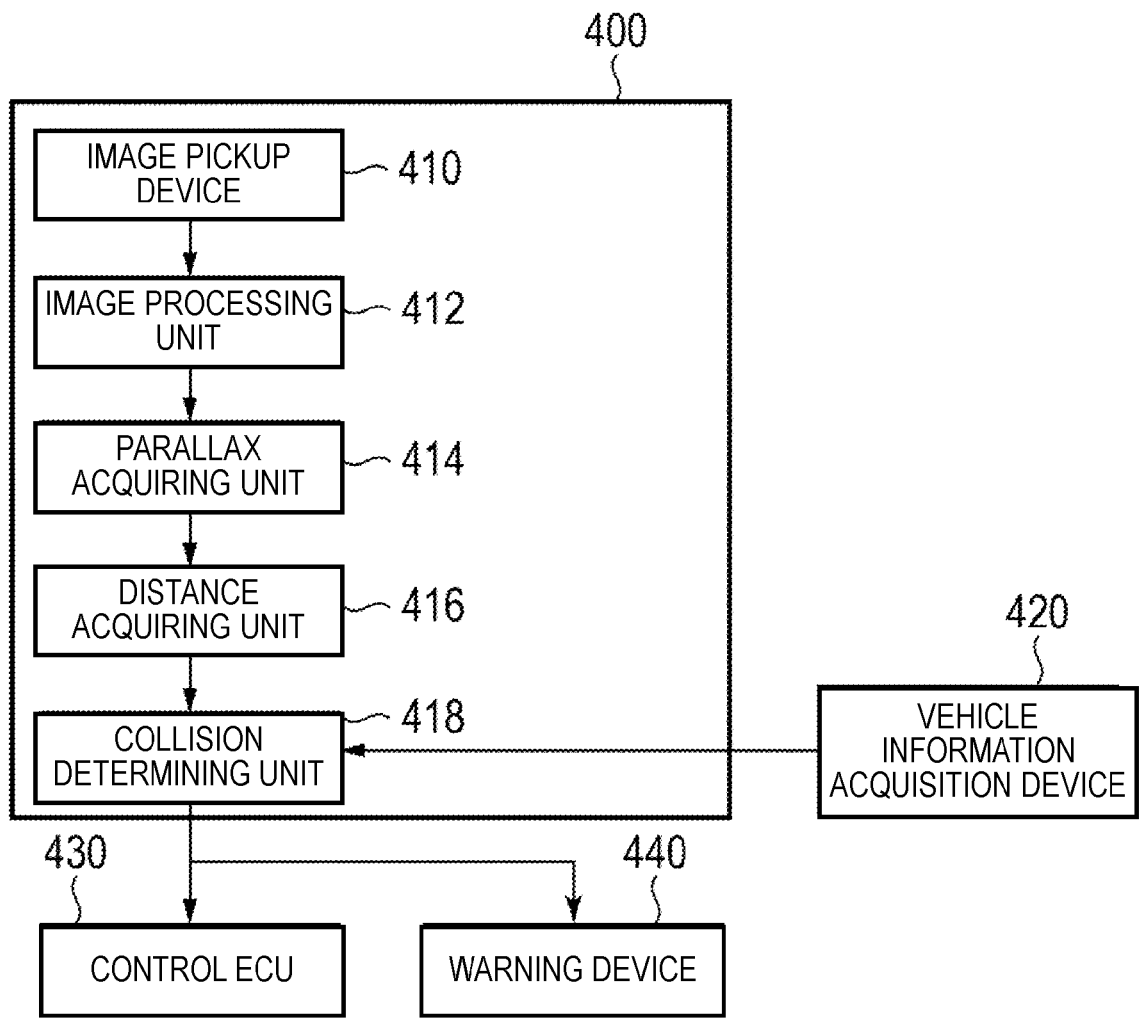
FIGS. 12A and 12B are configuration diagrams of a moving apparatus.
Figure 12B:
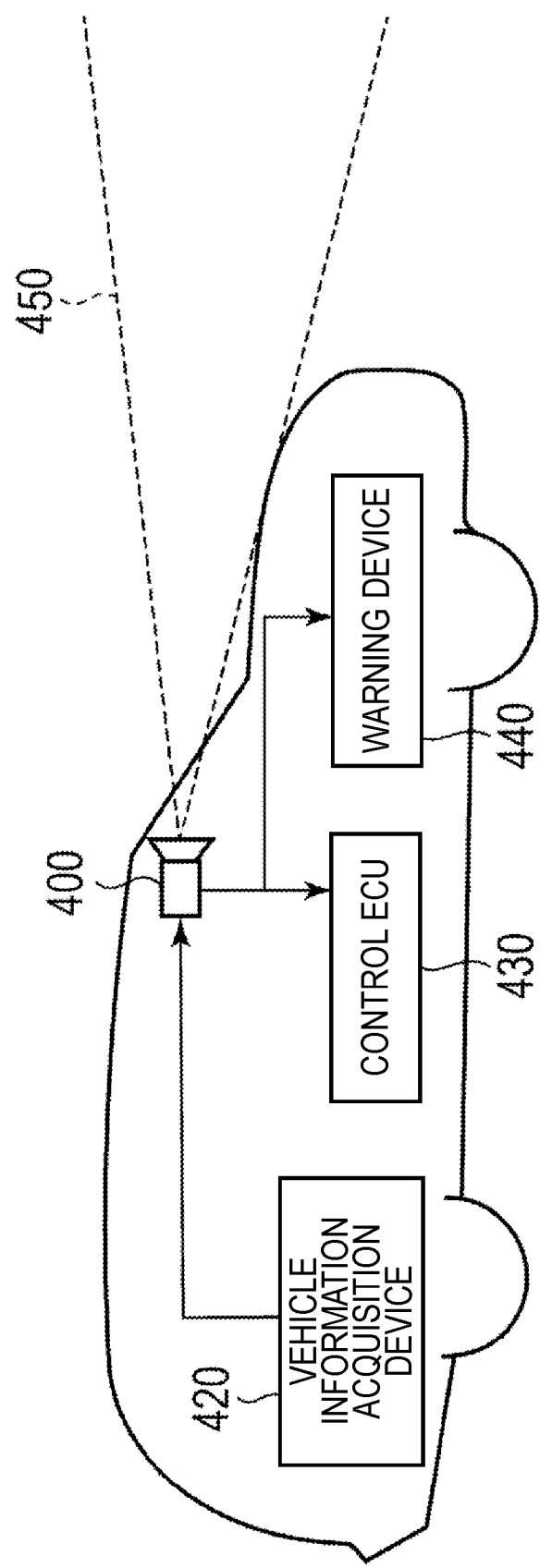

An image pickup system and a moving apparatus according to the fourth embodiment of the present invention will be described with reference to FIGS. 12A and 12B. FIGS. 12A and 12B are diagrams showing configurations of the image pickup system and the moving apparatus according to the present embodiment.

FIG. 12A shows an example of an image pickup system 400 related to a vehicle-mounted camera. The image pickup system 400 has an image pickup device 410. The image pickup device 410 is any of the image pickup devices 100 described in the first and second embodiments. The image pickup system 400 has an image processing unit 412 which performs image processing on a plurality of pieces of image data acquired by the image pickup device 410 and a parallax acquiring unit 414 which calculates a parallax (a phase difference of a parallax image) from the plurality of pieces of image data acquired by the image pickup device 410. In addition, the image pickup system 400 has a distance acquiring unit 416 which calculates a distance to an object based on the calculated parallax and a collision determining unit 418 which determines whether or not there is a possibility of a collision based on the calculated distance. In this case, the parallax acquiring unit 414 and the distance acquiring unit 416 are examples of a distance information acquiring unit which acquires distance information indicating a distance to the object. In other words, distance information is information related to a parallax, a defocus amount, a distance to the object, or the like. The collision determining unit 418 may determine a possibility of a collision using any of these pieces of distance information. The distance information acquiring unit may be realized by exclusively-designed hardware or may be realized by a software module. In addition, the distance information acquiring unit may be realized by an FPGA (Field Programmable Gate Array), an ASIC (Application Specific Integrated Circuit), or the like or by a combination thereof.

The image pickup system 400 is connected to a vehicle information acquisition device 420 and is capable of acquiring vehicle information such as a vehicle speed, a yaw rate, and a steering angle. In addition, a control ECU 430 which is a control device that outputs a control signal that causes a vehicle to generate a braking force based on a determination result of the collision determining unit 418 is connected to the image pickup system 400. In other words, the control ECU 430 is an example of a moving apparatus control unit which controls a moving apparatus based on distance information. Furthermore, the image pickup system 400 is also connected to a warning device 440 which issues a warning to a driver based on a determination result of the collision determining unit 418. For example, when it is found that the possibility of a collision is high as a determination result of the collision determining unit 418, the control ECU 430 performs vehicle control involving applying the brakes, releasing the gas pedal, suppressing engine output, or the like to avoid a collision and/or reduce damage. The warning device 440 issues a warning to a user by sounding an alarm, displaying warning information on a screen of a car navigation system or the like, vibrating a seat belt or a steering wheel, or the like.

In the present embodiment, an image of a periphery of the vehicle such as the front or rear of the vehicle is captured by the image pickup system 400. FIG. 12B shows the image pickup system 400 when an image of the front of the vehicle (an image pickup range 450) is captured. The vehicle information acquisition device 420 sends an instruction to operate the image pickup system 400 and have the image pickup system 400 perform image pickup. Using the image pickup device 100 according to the first to third embodiments described above as the image pickup device 410 enables the image pickup system 400 according to the present embodiment to improve accuracy of ranging.

While an example of controlling a vehicle to prevent a collision with another vehicle has been described above, the image pickup system can also be applied to controlling automated driving so that the vehicle follows another vehicle, controlling automated driving so that the vehicle stays within a lane, and the like. In addition, the image pickup system is not limited to a vehicle such as an automobile and can also be applied to a moving apparatus such as a ship, an airplane, or an industrial robot. Furthermore, besides moving apparatuses, the image pickup system can be applied to a wide variety of devices that utilize object recognition including an intelligent transportation system (ITS).

The embodiments described above merely represent specific examples of the present invention and the scope of the present invention is not limited to the configurations of the embodiments described above.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

OTHER EMBODIMENTS

Embodiments of the present invention can also be realized by a computer of a system or apparatus that reads out and executes computer executable instructions recorded on a storage medium (e.g., non-transitory computer-readable storage medium) to perform the functions of one or more of the above-described embodiment(s) of the present invention, and by a method performed by the computer of the system or apparatus by, for example, reading out and executing the computer executable instructions from the storage medium to perform the functions of one or more of the above-described embodiment(s). The computer may comprise one or more of a central processing unit (CPU), micro processing unit (MPU), or other circuitry, and may include a network of separate computers or separate computer processors. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-239610, filed on Dec. 14, 2017, which is hereby incorporated by reference herein in its entirety.

What is claimed is:

1. An image pickup device having a plurality of pixels, wherein one or more pixels among the plurality of pixels includes:
a photoelectric conversion unit;
a charge holding unit capable of holding a charge generated in the photoelectric conversion unit;
a transfer unit which transfers a charge of the photoelectric conversion unit to the charge holding unit when being in an on-state; and
an overflow control unit which discharges a charge of the photoelectric conversion unit when being in an on-state,
the one or more pixels being controlled so as to have a period in which both the transfer unit and the overflow control unit are switched to an off-state and the photoelectric conversion unit and the charge holding unit respectively hold a charge of a different frame, and
the overflow control unit has:
a first mode in which a first potential barrier is formed between the photoelectric conversion unit and a drain of the overflow control unit, the first potential barrier being lower than a potential barrier formed between the photoelectric conversion unit and the charge holding unit by the transfer unit in an off-state; and
a second mode in which a second potential barrier that is even lower than the first potential barrier is formed between the photoelectric conversion unit and the drain of the overflow control unit.

2. The image pickup device according to claim 1, wherein the transfer unit performs transfer of a charge from the photoelectric conversion unit to the charge holding unit a plurality of times in a period of one frame.

3. The image pickup device according to claim 2, wherein the overflow control unit lowers the potential barrier such that the larger the number of transfers performed in a period of one frame, the lower the potential barrier.

4. The image pickup device according to claim 1, wherein the overflow control unit lowers the potential barrier such that the smaller a charge amount to be accumulated in the photoelectric conversion unit, the lower the potential barrier.

5. The image pickup device according to claim 1, wherein the overflow control unit is a transistor, and
a height of the potential barrier is controlled by changing an off-state voltage to be applied to a gate of the overflow control unit.

6. The image pickup device according to claim 1, wherein the overflow control unit is a transistor, and
a height of the potential barrier is controlled by changing a drain voltage of the overflow control unit.

7. The image pickup device according to claim 1, wherein the overflow control unit is constituted by a plurality of transistors, and
a height of the potential barrier is controlled by changing a combination of an on-state and an off-state of the plurality of transistors.

8. An image pickup system, comprising:
the image pickup device according to claim 1; and
a signal processing unit which processes a signal output from the image pickup device.

9. A moving apparatus, comprising:
the image pickup device according to claim 1;
a distance information acquiring unit which acquires distance information indicating a distance to an object based on a signal output from the pixel of the image pickup device; and
a control unit which controls the moving apparatus based on the distance information.

* * * * *